(12) United States Patent
Song

(10) Patent No.: US 11,205,727 B2
(45) Date of Patent: Dec. 21, 2021

(54) ARRAY SUBSTRATE AND DISPLAY PANEL

(71) Applicants: CHONGQING HKC OPTOELECTRONICS TECHNOLOGY CO., LTD., Chongqing (CN); HKC CORPORATION LIMITED, Shenzhen (CN)

(72) Inventor: Zhenli Song, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 457 days.

(21) Appl. No.: 16/338,998

(22) PCT Filed: Oct. 31, 2018

(86) PCT No.: PCT/CN2018/112862
§ 371 (c)(1),
(2) Date: Apr. 3, 2019

(87) PCT Pub. No.: WO2020/062397
PCT Pub. Date: Apr. 2, 2020

(65) Prior Publication Data
US 2021/0328069 A1    Oct. 21, 2021

(30) Foreign Application Priority Data
Sep. 30, 2018  (CN) .......................... 201821629519.6

(51) Int. Cl.
*H01L 29/04*    (2006.01)
*H01L 29/786*   (2006.01)
*H01L 27/12*    (2006.01)
*G02F 1/1362*   (2006.01)

(52) U.S. Cl.
CPC .... *H01L 29/78633* (2013.01); *H01L 27/1214* (2013.01); *G02F 1/136209* (2013.01); *G02F 1/136222* (2021.01)

(58) Field of Classification Search
None
See application file for complete search history.

(56) References Cited

U.S. PATENT DOCUMENTS

2008/0258140 A1   10/2008  Lee et al.
2018/0308868 A1*  10/2018  Tan ................... G02F 1/133512

FOREIGN PATENT DOCUMENTS

| CN | 102956714 A | 3/2013 |
| CN | 206618932 U | 11/2017 |
| CN | 107885004 A | 4/2018 |
| CN | 108389867 A | 8/2018 |

OTHER PUBLICATIONS

Jiangang Wu, the ISA written comments, dated Jun. 2019, CN.

* cited by examiner

*Primary Examiner* — Jack S Chen

(57) ABSTRACT

The present application discloses an array substrate and a display panel. The array substrate includes an underlying substrate and a first color resist layer. The first color resist layer is formed on the underlying substrate to block a channel region. The first color resist layer has at least two color resist layers, and the two color resist layers correspond to different colors and are disposed in a stack-up manner.

17 Claims, 5 Drawing Sheets

ARRAY SUBSTRATE AND DISPLAY PANEL

The present application claims priority to the Chinese Patent Application No. CN201821629519.6, filed to National Intellectual Property Administration, PRC on Sep. 30, 2018, and entitled "ARRAY SUBSTRATE AND DISPLAY PANEL", which is incorporated herein by reference in its entirety.

TECHNICAL FIELD

The present application relates to the technical field of displaying, and particularly, to an array substrate and a display panel.

BACKGROUND

The description herein merely provides background information related to the present application, but does not necessarily constitute the prior art.

With the development and advance of science and technology, liquid crystal displays have multiple advantages of thin body thickness, less electricity consumption, radiation-free, and the like, and therefore are widely applied. Most liquid crystal displays in the market are backlight liquid crystal displays, each including a liquid crystal panel and a backlight module. The liquid crystal panel includes a color film substrate (also referred to as a color filter (CF) substrate) and a thin film transistor array substrate (TT substrate), and transparent electrodes exist on the opposite inner sides of the foregoing substrates. A layer of liquid crystal (LC) molecules is sandwiched between the two sheets of substrates.

The basic composition of a thin film transistor includes two metal (typically Al or Cu) layers, two insulating layers, one active layer, and one ohmic contact layer that is between a semiconductor layer and a metal layer. Electrodes formed by the two metal layers are a scanning signal metal electrode and a data signal metal electrode respectively. The two insulating layers respectively are an insulating layer (GI layer) below the active layer and an insulating layer (PV layer) above the active layer. The active layer and a doped layer that has ohmic contact effect usually are of an island pattern in the thin film transistor, and therefore, sometimes are referred to as an active island or a silicon island. A structure of the thin film transistor may be divided into a bottom gate structure and a top gate structure according to a vertical position relationship between a gate and the silicon island. The top gate structure is exposed to backlight, resulting in performance degradation of the TFT device.

SUMMARY

In view of the foregoing disadvantages, the present application provides an array substrate and a display panel, so that an impact caused by backlight on a TFT device can be prevented.

To achieve the foregoing objective, the present application provides an array substrate, including: an underlying substrate; a second metal layer, including a source metal layer and a drain metal layer, and formed on the underlying substrate; a channel region, located between the source metal layer and the drain metal layer; an ohmic contact layer, formed on the source metal layer and the drain metal layer and located within the channel region; an active layer, formed on the ohmic contact layer and located within the channel region; a first insulating layer (GI layer), formed on the active layer, the source metal layer, and the drain metal layer; a first metal layer, formed on the first insulating layer; a second insulating layer (PV layer), formed on the first metal layer and the first insulating layer; and a first color resist layer, formed on the underlying substrate to block the channel region, where the first color resist layer has at least two color resist layers, and the two color resist layers correspond to different colors and are disposed in a stack-up manner.

Optionally, the array substrate includes a non-display region and a display region. The display region and the non-display region are connected via the drain metal layer. The first color resist layer and the second metal layer are both located within the non-display region, and the first color resist layer and the second metal layer are disposed in positional correspondence.

Optionally, the array substrate includes a non-display region and a display region. The display region and the non-display region are connected via the drain metal layer. The first color resist layer and the channel region are both located within the non-display region, and the first color resist layer and the channel region are disposed in positional correspondence.

Optionally, the array substrate includes a second color resist layer, and the display region includes pixels. The second color resist layer is located within the display region, and color resist layers of the second color resist layer are distributed in parallel within the display region and are disposed in positional correspondence to the pixels.

Optionally, the first color resist layer includes a red color resist and a green color resist.

Optionally, the first color resist layer includes a red color resist and a blue color resist.

Optionally, the first color resist layer includes a green color resist and a blue color resist.

Optionally, the first color resist layer includes a red color resist, a green color resist, and a blue color resist.

The present application further discloses an array substrate. The array substrate includes: an underlying substrate; a second metal layer, including a source metal layer and a drain metal layer, and formed on the underlying substrate; a channel region, located between the source metal layer and the drain metal layer; an ohmic contact layer, formed on the source metal layer and the drain metal layer and located within the channel region; an active layer formed on the ohmic contact layer and located within the channel region; a first insulating layer (GI layer) formed on the active layer, the source metal layer, and the drain metal layer; a first metal layer, formed on the first insulating layer; a second insulating layer (PV layer), formed on the first metal layer and the first insulating layer; and a first color resist layer, formed on the underlying substrate to block the channel region, where the color resist layer has at least two color resist layers, and the two color resist layers correspond to different colors and are disposed in a stack-up manner.

The array substrate includes a non-display region and a display region. The display region and the non-display region are connected via the drain metal layer. The first color resist layer and the second metal layer are both located within the non-display region, and the first color resist layer and the second metal layer are disposed in positional correspondence.

The array substrate includes a second color resist layer, and the display region includes pixels. The second color resist layer is located within the display region, and color resist layers of the second color resist layer are distributed in parallel within the display region and are disposed in positional correspondence to the pixels.

The present application further discloses a display panel. The display panel includes array substrates, the array substrates, including: an underlying substrate; a second metal layer, including a source metal layer and a drain metal layer, and formed on the underlying substrate; a channel region, located between the source metal layer and the drain metal layer; an ohmic contact layer, formed on the source metal layer and the drain metal layer and located within the channel region; an active layer, formed on the ohmic contact layer and located within the channel region; a first insulating layer (GI layer), formed on the active layer, the source metal layer, and the drain metal layer; a first metal layer, formed on the first insulating layer; a second insulating layer (PV layer), formed on the first metal layer and the first insulating layer; and a first color resist layer, formed on the underlying substrate to block the channel region, where the first color resist layer has at least two color resist layers, and the two color resist layers correspond to different colors and are disposed in a stack-up manner.

A channel of a top gate structure is in direct contact with the underlying substrate. When backlight is turned on, the backlight passes through the underlying substrate and falls on the channel, resulting in performance degradation of a TFT device. In consideration of the fact that during a manufacturing procedure of the pixel structure, a color resist deposition process needs to be repeated several times, and the backlight can be blocked as long as any two different color resist layers are disposed in a stack-up manner. Therefore, in this solution, stacked color resist layers are formed in a color resist layer manufacturing process, to block the channel region, and prevent the channel from being exposed to the backlight. In addition, no additional process needs to be added, so that costs are reduced. In addition, a color resist is made of a non-conductive material, and no parasitic capacitance is generated between the color resist and the TFT device and between the color resist and other conductive lines, so that performance of the TFT device is stable.

BRIEF DESCRIPTION OF DRAWINGS

The drawings are included to provide understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may further derive other accompanying drawings from these accompanying drawings without creative efforts. In the accompanying drawings.

DETAILED DESCRIPTION

Figure 1:
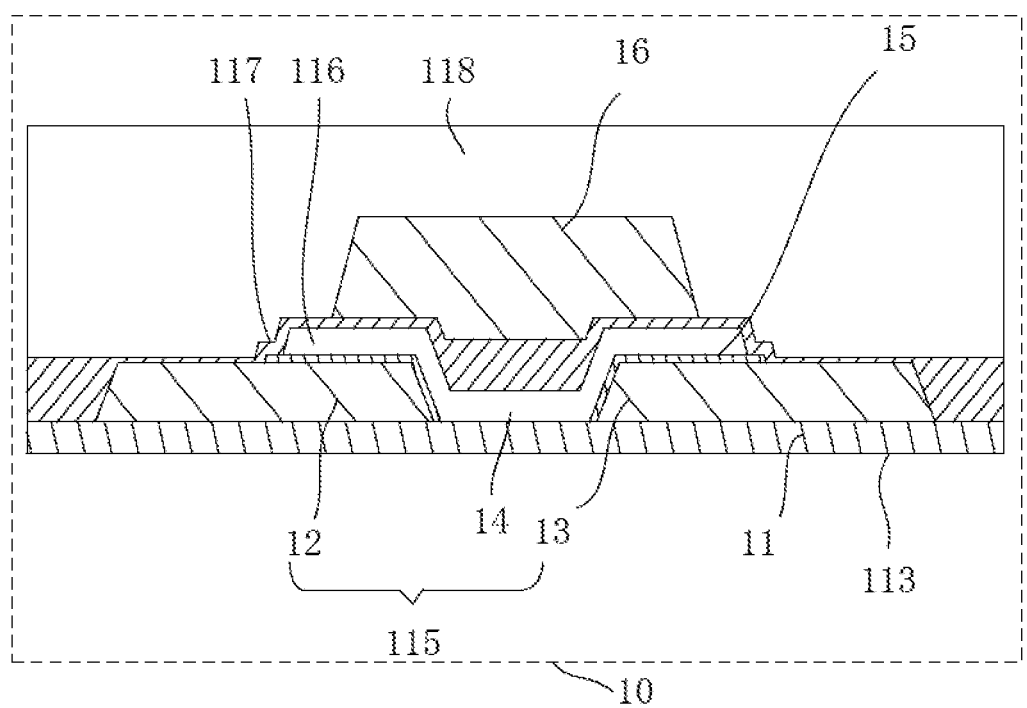
FIG. 1 is a schematic diagram of a top gate structure.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", and the like are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms "first", "second" are merely for a descriptive purpose, and cannot to be understood to indicate or imply a relative importance, or implicitly indicate the number of the indicated technical features. Hence, the features defined by "first", "second" can explicitly or implicitly include one or more of the features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood for those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations and/or components, but do not preclude the presence or addition of one or more other features, integers, steps, operations, components and/or combinations thereof.

The present application is described below with reference to the drawings and optional embodiments.

Figure 2:
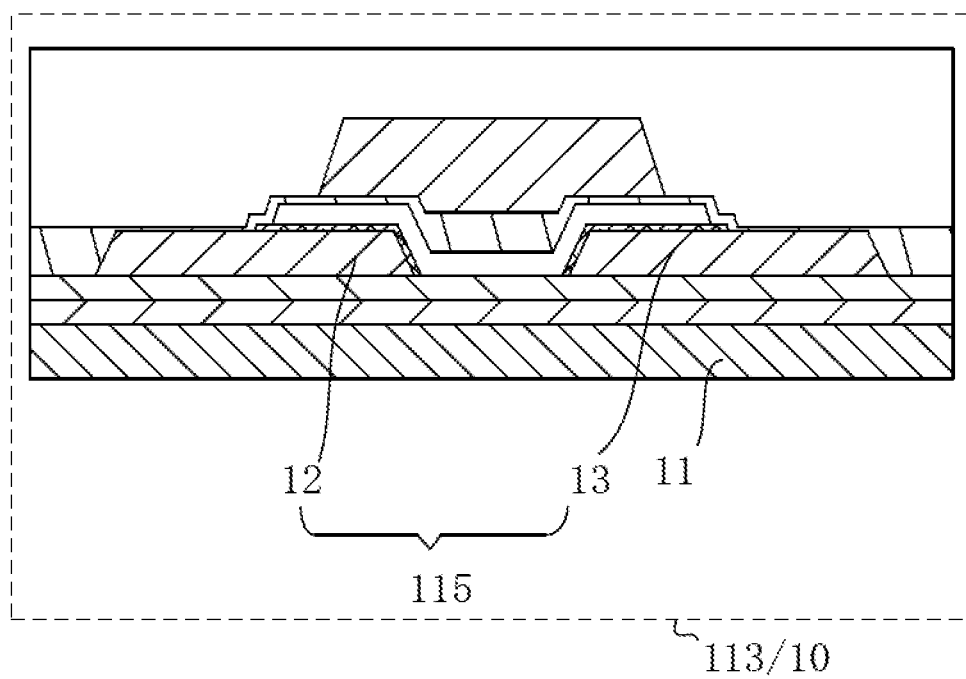
FIG. 2 is a schematic diagram of a pixel structure according to an embodiment of the present application.
Figure 3:
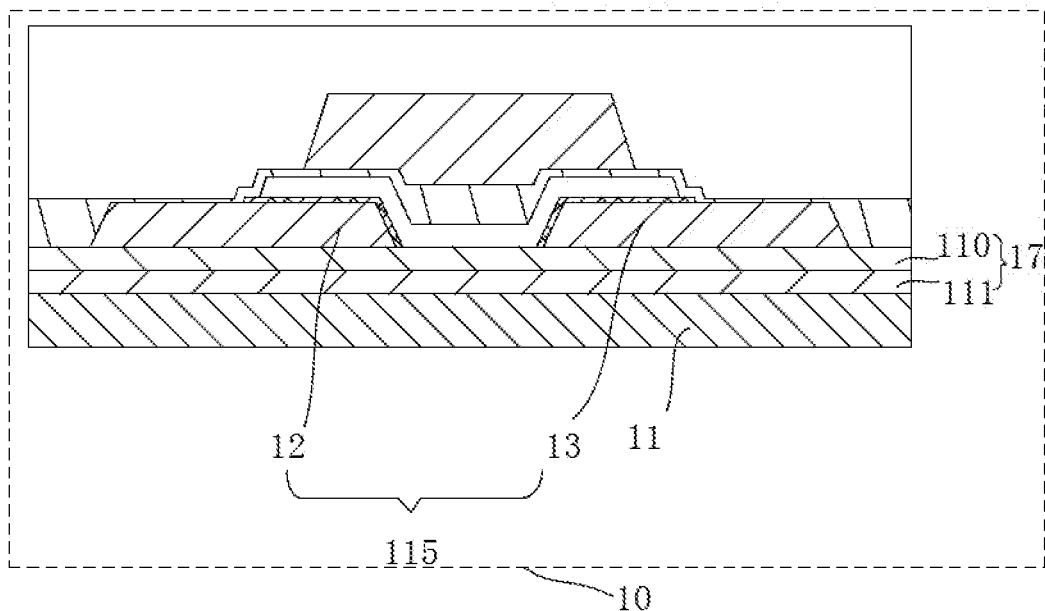
FIG. 3 is a schematic diagram of a pixel structure of a first color resist layer which consists of a red color resist and a green color resist according to an embodiment of the present application.
Figure 4:
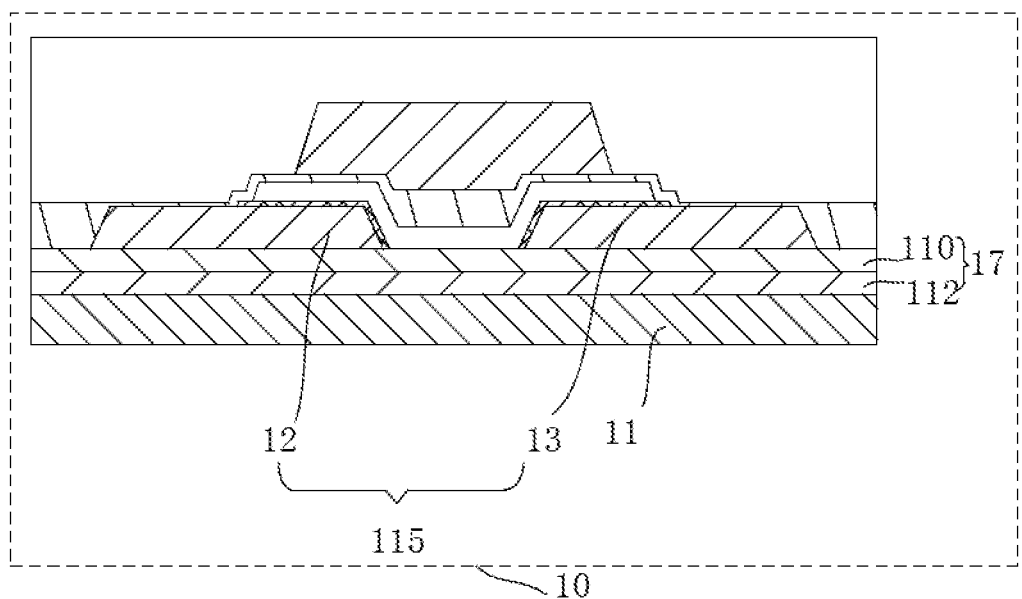
FIG. 4 is a schematic diagram of a pixel structure of a first color resist layer which consists of a red color resist and a blue color resist according to an embodiment of the present application.
Figure 5:
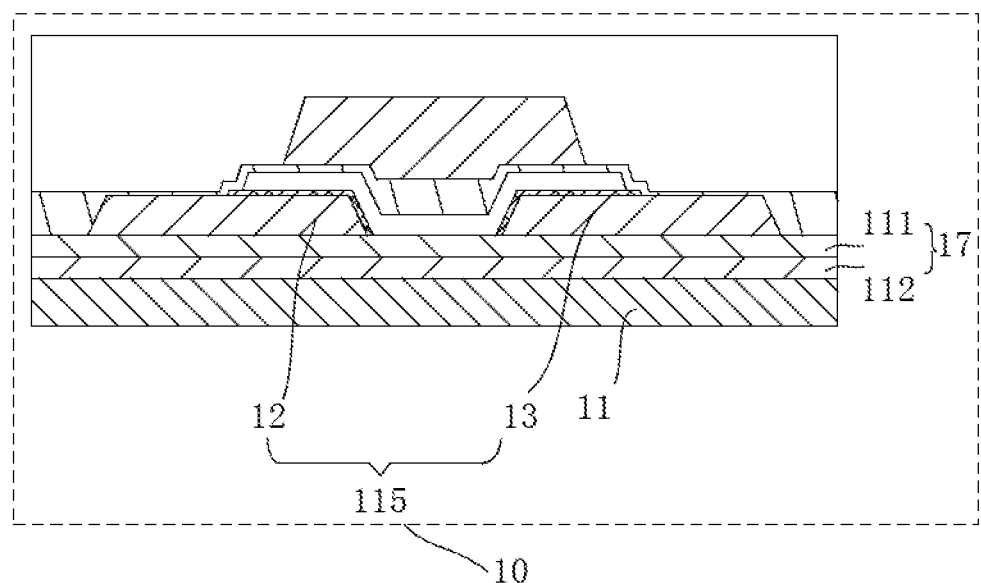
FIG. 5 is a schematic diagram of a pixel structure of a first color resist layer which consists of a green color resist and a blue color resist according to an embodiment of the present application.
Figure 6:
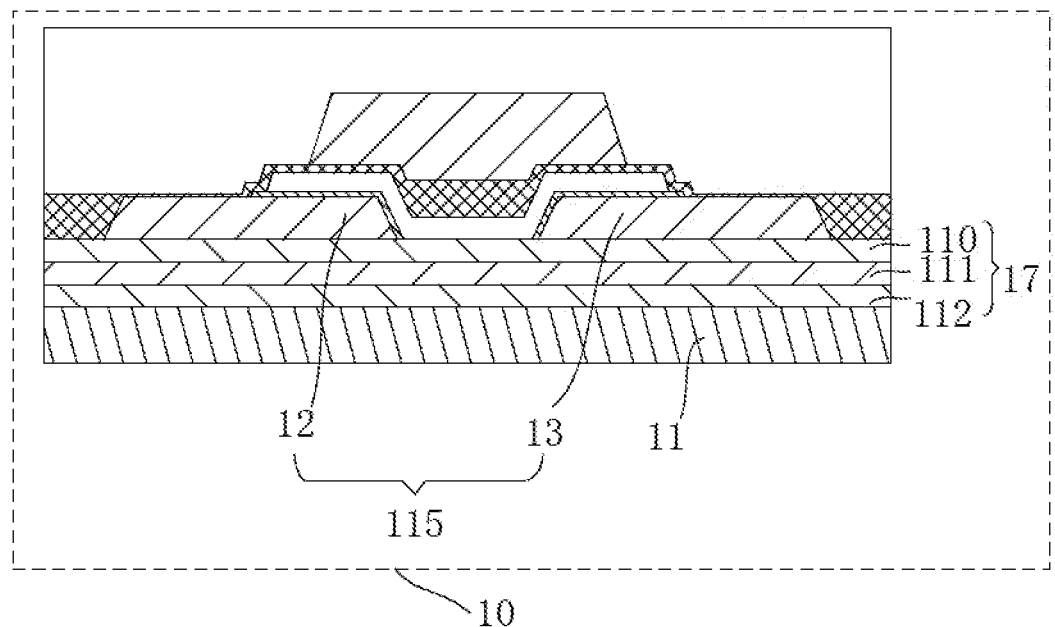
FIG. 6 is a schematic diagram of a pixel structure of a first color resist layer which consists of a red color resist, a green color resist, and a blue color resist according to an embodiment of the present application.
Figure 7:
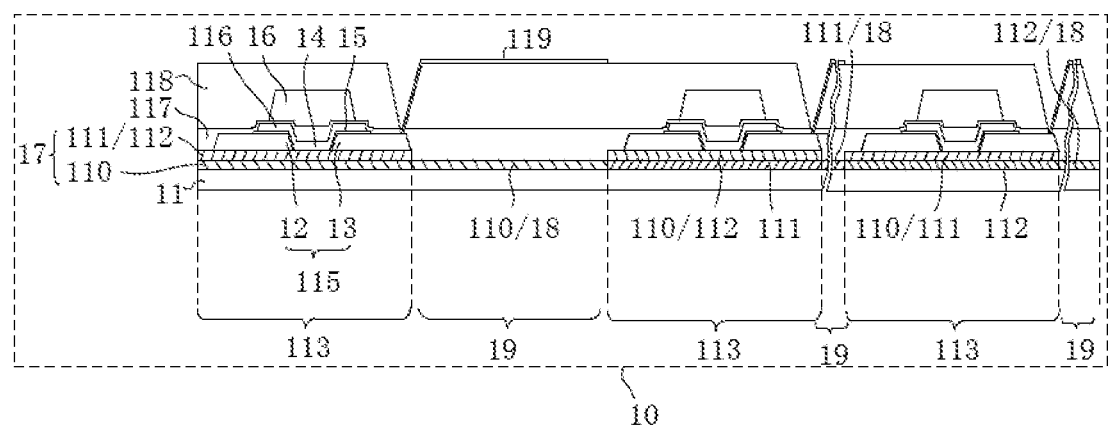
FIG. 7 is a schematic diagram of an array substrate according to an embodiment of the present application.

As shown in FIG. 1 to FIG. 7, an embodiment of the present application discloses an array substrate 10. The array substrate 10 includes an underlying substrate 11; a second metal layer 115, including a source metal layer 12 and a drain metal layer 13, and formed on the underlying substrate 11; a channel region 14, located between the source metal layer 12 and the drain metal layer 13; an ohmic contact layer 15, formed on the source metal layer 12 and the drain metal layer 13 and located within the channel region 14; an active layer 116, formed on the ohmic contact layer 15 and located within the channel region 14; a first insulating layer (GI layer) 117, formed on the active layer 116, the source metal layer 12, and the drain metal layer 13; a first metal layer 16, formed on the first insulating layer 117; a second insulating layer (PV layer) 118, formed on the first metal layer 16 and the first insulating layer 117; and a first color resist layer 17, formed on the underlying substrate 11 to block the channel region 14. The first color resist layer 17 has at least two color resist layers, and the two color resist layers correspond to different colors and are disposed in a stack-up manner.

In this solution, the channel region 14 of a top gate structure is in direct contact with the underlying substrate 11. When backlight is turned on, the backlight passes through the underlying substrate 11 and falls on the channel region 14, resulting in performance degradation of a TFT device. In consideration of the fact that during a manufacturing procedure of the pixel structure, a color resist deposition process needs to be repeated several times, and the backlight can be blocked as long as any two different color resist layers are disposed in a stack-up manner. Therefore, in this solution, stacked color resist layers are formed in a color resist layer manufacturing process, to block the channel region 14, and prevent the channel region 14 from being exposed to the backlight. In addition, no additional process needs to be added, so that costs are reduced. In addition, a color resist is made of a non-conductive material, and no parasitic capacitance is generated between the color resist and the TFT device and between the color resist and other conductive lines, so that performance of the TFT device is stable.

Optionally, in this embodiment, the array substrate 10 includes a non-display region 113 and a display region 19. The display region 19 and the non-display region 113 are connected via the drain metal layer 13. The first color resist layer 17 and the second metal layer 115 are both located within the non-display region 113, and the first color resist layer 17 and the second metal layer 115 are disposed in positional correspondence.

In this solution, the non-display region 113 does not need to be light-transmissive, and therefore the first color resist layer 17 is disposed in the non-display region 113, so that the non-display region 113 may be prevented from being exposed to the backlight. Because the second metal layer 115 is located within the non-display region 113, the channel region 14 is also located within the non-display region 113. If the first color resist layer 17 and the second metal layer 115 are disposed in positional correspondence, the first color resist layer 17 may block the second metal layer 115, so that the second metal layer is prevented from being exposed to the backlight. In addition, it can be ensured that the channel region 14 is fully prevented from being exposed to the backlight, so that performance of the TFT device is stable.

Optionally, in this embodiment, the array substrate 10 includes a non-display region 113 and a display region 19. The display region 19 and the non-display region 113 are connected via the drain metal layer 13. The first color resist layer 17 and the channel region 14 are both located within the non-display region 113, and the first color resist layer 17 and the channel region 14 are disposed in positional correspondence.

In this solution, performance of the TFT device is affected because the channel region 14 is exposed to the backlight, and the channel region is located within the non-display region 113. Therefore, performance of the TFT device can be stable as long as the channel region 14 of the underlying substrate 11 is prevented from being exposed to the backlight. Therefore, in this solution, the first color resist layer 17 is deposited only on the channel region 14 of the non-display region 113 and is disposed in positional correspondence to the channel region 14, so that the color resist usage efficiency can be improved.

Optionally, in this embodiment, the array substrate 10 includes a second color resist layer 18, and the display region 19 includes pixels 114. The second color resist layer 18 is located within the display region 19, and color resist layers of the second color resist layer 18 are distributed in parallel within the display region 19 and are disposed in positional correspondence to the pixels 114.

In this solution, because the pixels 114 in the display region 19 need to be exposed to the backlight, to display colors of the corresponding pixels 114, the color resist layers disposed on the pixels 114 are distributed in parallel, and color resists having a same color as that of each pixel 114 is disposed on the pixel 114, so that the pixels 114 function well.

Optionally, in this embodiment, the first color resist layer 17 includes a red color resist 110 and a green color resist 111.

In this solution, a layer of the red color resist 110 can transmit only red light, and the red light cannot pass through the green color resist 111. Therefore, the first color resist layer 17 formed by stacking the red color resist 110 and the green color resist 111 can block the backlight, so that performance of the TFT device is stable.

Optionally, in this embodiment, the first color resist layer 17 includes a red color resist 110 and a blue color resist 112.

In this solution, a layer of the red color resist 110 can transmit only red light, and the red light cannot pass through the blue color resist 112. Therefore, the first color resist layer 17 formed by stacking the red color resist 110 and the blue color resist 112 can block the backlight, so that performance of the TFT device is stable.

Optionally, in this embodiment, the first color resist layer 17 includes a green color resist 111 and a blue color resist 112.

In this solution, the green color resist 111 can transmit only green light, and the green light cannot pass through the blue color resist 112. Therefore, the first color resist layer 17 formed by stacking the green color resist 110 and the blue color resist 112 can block the backlight, so that performance of the TFT device is stable.

Optionally, in this embodiment, the first color resist layer 17 includes a red color resist 110, a green color resist 111, and a blue color resist 112.

In this solution, the red color resist 110 can transmit only red light, and the red light cannot pass through the green color resist 111 and the blue color resist 112. Therefore, the first color resist layer 17 formed by stacking the red color resist 110, the green color resist 111, and the blue color resist 112 can block the backlight, so that performance of the TFT device is stable.

Optionally, in this embodiment, an indium tin oxide (ITO) layer 119 is formed on the second insulating layer within the display region, and is used as a transparent conductive thin film, to reduce electronic radiation, ultraviolet light, and infrared light harmful to human bodies.

As shown in FIGS. 1 to 7, another embodiment of the present application discloses an array substrate 10. The array substrate 10 includes an underlying substrate 11; a second metal layer 115, including a source metal layer 12 and a drain metal layer 13, and formed on the underlying substrate 11; a channel region 14, located between the source metal layer 12 and the drain metal layer 13; an ohmic contact layer 15, formed on the source metal layer 12 and the drain metal layer 13 and located within the channel region 14; an active layer 116, formed on the ohmic contact layer 15 and located within the channel region 14; a first insulating layer (GI layer) 117, formed on the active layer 116, the source metal layer 12, and the drain metal layer 13; a first metal layer 16, formed on the first insulating layer 117; a second insulating layer (PV layer) 118, formed on the first metal layer 16 and the first insulating layer 117; and a first color resist layer 17, formed on the underlying substrate 11 to block the channel region 14, where the first color resist layer 17 has at least two color resist layers, and the two color resist layers correspond to different colors and are disposed in a stack-up manner.

The array substrate 10 includes a non-display region 113 and a display region 19. The display region 19 and the non-display region 113 are connected via the drain metal layer 13. The first color resist layer 17 and the second metal layer 115 are both located within the non-display region 113, and the first color resist layer 17 and the second metal layer 115 are disposed in positional correspondence.

The array substrate 10 includes a non-display region 113 and a display region 19. The display region 19 and the non-display region 113 are connected via the drain metal layer 13. The first color resist layer 17 and the channel region 14 are both located within the non-display region 113, and the first color resist layer 17 and the channel region 14 are disposed in positional correspondence.

In this solution, the channel region 14 of a top gate structure is in direct contact with the underlying substrate 11. When backlight is turned on, the backlight passes through the underlying substrate 11 and falls on the channel region 14, resulting in performance degradation of a TFT device. In consideration of the fact that during a manufacturing procedure of the pixel structure, a color resist deposition process needs to be repeated several times, and the backlight can be blocked as long as any two different color resist layers are disposed in a stack-up manner. Therefore, in this solution, stacked color resist layers are formed in a color resist layer manufacturing process, to block the channel region 14, and prevent the channel region 14 from being exposed to the backlight. In addition, no additional process needs to be added, so that costs are reduced. In addition, a color resist is made of a non-conductive material, and no parasitic capacitance is generated between the color resist and the TFT device and between the color resist and other conductive lines, so that performance of the TFT device is stable. The non-display region 113 does not need to be light-transmissive, and therefore the first color resist layer 17 is disposed in the non-display region 113, so that the non-display region 113 may be prevented from being exposed to the backlight. Because the channel region 14 is located within the second metal layer 115 in the display region 19, if the first color resist layer 17 and the second metal layer 115 are disposed in positional correspondence, the first color resist layer 17 may block the second metal layer 115, so that the prevented from being exposed to the backlight. In addition, it can be ensured that the channel region 14 is fully prevented from being exposed to the backlight, so that performance of the TFT device is stable. Because the pixels 114 in the display region 19 need to be exposed to the backlight, to display colors of the corresponding pixels 114, in this solution, the color resist layers disposed on the pixels 114 are distributed in parallel, and color resists having a same color as that of each pixel 114 is disposed on the pixel 114, so that the pixels 114 function well.

As shown in FIG. 1 to FIG. 7, another embodiment of the present application discloses a display panel, including an array substrate 10. The array substrate 10 includes an underlying substrate 11; a second metal layer 115, including a source metal layer 12 and a drain metal layer 13, and formed on the underlying substrate 11; a channel region 14, located between the source metal layer 12 and the drain metal layer 13; an ohmic contact layer 15, formed on the source metal layer 12 and the drain metal layer 13 and located within the channel region 14; an active layer 116, formed on the ohmic contact layer 15 and located within the channel region 14; a first insulating layer (GI layer) 117, formed on the active layer 116, the source metal layer 12, and the drain metal layer 13; a first metal layer 16, formed on the first insulating layer 117; a second insulating layer (PV layer) 118, formed on the first metal layer 16 and the first insulating layer 117; and a first color resist layer 17, formed on the underlying substrate 11 to block the channel region 14. The first color resist layer 17 has at least two color resist layers, and the two color resist layers correspond to different colors and are disposed in a stack-up manner.

The panel in the present application may be a twisted nematic panel (TN panel), an in-pane switching panel (IPS panel), a multi-domain vertical alignment panel (VA panel), or the like. Certainly, the panel may be a panel of another type provided that the panel is applicable.

The foregoing describes the present application in detail with reference to specific embodiments, and it should not be considered that specific implementation of the present application is limited to the description. A person of ordinary skill in the art of the present invention can make various simple deductions or substitutions without departing from the concept of the present application, and the deductions and substitutions shall fall within the protection scope of the present application.

What is claimed is:
1. An array substrate, comprising:
an underlying substrate;
a second metal layer, comprising a source metal layer and a drain metal layer, and formed on the underlying substrate;
a channel region, located between the source metal layer and the drain metal layer;
an ohmic contact layer, formed on the source metal layer and the drain metal layer and located within the channel region;
an active layer, formed on the ohmic contact layer and located within the channel region;
a first insulating layer, formed on the active layer, the source metal layer, and the drain metal layer,
a first metal layer, formed on the first insulating layer;
a second insulating layer, formed on the first metal layer and the first insulating layer; and
a first color resist layer, formed on the underlying substrate to block the channel region, wherein
the first color resist layer has at least two color resist layers, and the two color resist layers correspond to different colors and are disposed in a stack-up manner.

2. The array substrate according to claim 1, wherein the array substrate comprises a non-display region and a display region, and the display region and the non-display region are connected via the drain metal layer; and the first color resist layer and the second metal layer are both located within the non-display region, and the first color resist layer and the second metal layer are disposed in positional correspondence.

3. The array substrate according to claim 1, wherein the array substrate comprises a non-display region and a display region, and the display region and the non-display region are connected via the drain metal layer; and the first color resist layer and the channel region are both located within the non-display region, and the first color resist layer and the channel region are disposed in positional correspondence.

4. The array substrate according to claim 2, wherein the array substrate comprises a second color resist layer, and the display region comprises pixels; and the second color resist layer is located within the display region, and color resist layers of the second color resist layer are distributed in parallel within the display region and are disposed in positional correspondence to the pixels.

5. The array substrate according to claim 1, wherein the first color resist layer comprises a red color resist and a green color resist.

6. The array substrate according to claim 1, wherein the first color resist layer comprises a red color resist and a blue color resist.

7. The array substrate according to claim 1, wherein the first color resist layer comprises a green color resist and a blue color resist.

8. The array substrate according to claim 1, wherein the first color resist layer comprises a red color resist, a green color resist, and a blue color resist.

9. An array substrate, comprising:
an underlying substrate;
a second metal layer, comprising a source metal layer and a drain metal layer, and formed on the underlying substrate;
a channel region, located between the source metal layer and the drain metal layer;
an ohmic contact layer, formed on the source metal layer and the drain metal layer and located within the channel region;
an active layer, formed on the ohmic contact layer and located within the channel region;
a first insulating layer, formed on the active layer, the source metal layer, and the drain metal layer;
a first metal layer, formed on the first insulating layer;
a second insulating layer, formed on the first metal layer and the first insulating layer; and
a first color resist layer, formed on the underlying substrate to block the channel region, wherein
the first color resist layer has at least two color resist layers, and the two color resist layers correspond to different colors and are disposed in a stack-up manner;
the array substrate comprises a non-display region and a display region, the display region and the non-display region are connected via the drain metal layer, the first color resist layer and the second metal layer are both located within the non-display region, and the first color resist layer and the second metal layer are disposed in positional correspondence; and the array substrate comprises a second color resist layer, the display region comprises pixels, the second color resist layer is located within the display region, and color resist layers of the second color resist layer are distributed in parallel within the display region and are disposed in positional correspondence to the pixels.

10. A display panel, comprising an array substrate, wherein the array substrate comprises:
an underlying substrate;
a second metal layer, comprising a source metal layer and a drain metal layer, and formed on the underlying substrate;
a channel region, located between the source metal layer and the drain metal layer;
an ohmic contact layer, formed on the source metal layer and the drain metal layer and located within the channel region;
an active layer, formed on the ohmic contact layer and located within the channel region;
a first insulating layer, formed on the active layer, the source metal layer, and the drain metal layer;
a first metal layer, formed on the first insulating layer;
a second insulating layer, formed on the first metal layer and the first insulating layer; and
a first color resist layer, formed on the underlying substrate to block the channel region, wherein
the first color resist layer has at least two color resist layers, and the two color resist layers correspond to different colors and are disposed in a stack-up manner.

11. The display panel according to claim 10, wherein the array substrate comprises a non-display region and a display region, and the display region and the non-display region are connected via the drain metal layer; and the first color resist layer and the second metal layer are both located within the non-display region, and the first color resist layer and the second metal layer are disposed in positional correspondence.

12. The display panel according to claim 10, wherein the array substrate comprises a non-display region and a display region, and the display region and the non-display region are connected via the drain metal layer; and the first color resist layer and the channel region are both located within the non-display region, and the first color resist layer and the channel region are disposed in positional correspondence.

13. The display panel according to claim 11, wherein the array substrate comprises a second color resist layer and the display region comprises pixels; and the second color resist layer is located within the display region, and color resist layers of the second color resist layer are distributed in parallel within the display region and are disposed in positional correspondence to the pixels.

14. The display panel according to claim 10, wherein the first color resist layer comprises a red color resist and a green color resist.

15. The display panel according to claim 10, wherein the first color resist layer comprises a red color resist and a blue color resist.

16. The display panel according to claim 10, wherein the first color resist layer comprises a green color resist and a blue color resist.

17. The display panel according to claim 10, wherein the first color resist layer comprises a red color resist, a green color resist, and a blue color resist.

* * * * *